(12) United States Patent
Kammler et al.

(10) Patent No.: US 11,705,455 B2
(45) Date of Patent: Jul. 18, 2023

(54) HIGH VOLTAGE EXTENDED DRAIN MOSFET (EDMOS) DEVICES IN A HIGH-K METAL GATE (HKMG)

(71) Applicant: GLOBALFOUNDRIES U.S. INC., Santa Clara, CA (US)

(72) Inventors: Thorsten E. Kammler, Dresden (DE); Peter Baars, Dresden (DE)

(73) Assignee: GLOBALFOUNDRIES U.S. INC., Malta, NY (US)

( * ) Notice: Subject to any disclaimer, the term of this patent is extended or adjusted under 35 U.S.C. 154(b) by 563 days.

(21) Appl. No.: 16/930,547

(22) Filed: Jul. 16, 2020

(65) Prior Publication Data
US 2022/0020746 A1 Jan. 20, 2022

(51) Int. Cl.
| | | |
|---|---|---|
| H01L 27/092 | (2006.01) | |
| H01L 21/8238 | (2006.01) | |
| H01L 29/161 | (2006.01) | |
| H01L 29/423 | (2006.01) | |
| H01L 29/49 | (2006.01) | |
| H01L 29/66 | (2006.01) | |
| H01L 29/78 | (2006.01) | |

(52) U.S. Cl.
CPC .. *H01L 27/0928* (2013.01); *H01L 21/823814* (2013.01); *H01L 21/823842* (2013.01); *H01L 21/823857* (2013.01); *H01L 21/823892* (2013.01); *H01L 29/161* (2013.01); *H01L 29/42364* (2013.01); *H01L 29/4966* (2013.01); *H01L 29/66492* (2013.01); *H01L 29/7833* (2013.01)

(58) Field of Classification Search
CPC ......... H01L 27/0928; H01L 21/823814; H01L 21/823842; H01L 21/823857; H01L 21/823892; H01L 29/7833; H01L 27/0924; H01L 27/088; H01L 21/823462; H01L 21/823807; H01L 21/823431; H01L 29/66545
See application file for complete search history.

(56) References Cited

U.S. PATENT DOCUMENTS

| | | | |
|---|---|---|---|
| 8,258,584 B2 | 9/2012 | Chen et al. | |
| 8,962,414 B1 | 2/2015 | Faul et al. | |
| 2008/0157203 A1 | 7/2008 | Shin | |
| 2015/0145023 A1* | 5/2015 | Arigane | H01L 29/792 438/587 |
| 2017/0271513 A1* | 9/2017 | Yamaguchi | H10B 43/30 |

* cited by examiner

*Primary Examiner* — Selim U Ahmed
(74) *Attorney, Agent, or Firm* — Anthony Canale; Andrew M. Calderon; Calderon Safran & Cole, P.C.

(57) ABSTRACT

The present disclosure relates to semiconductor devices, and more particularly, to high voltage extended drain MOSFET (EDMOS) devices in a high-k metal gate (HKMG) and methods of manufacture. A structure of the present disclosure includes a plurality of extended drain MOSFET (EDMOS) devices on a high voltage well with a split-gate dielectric material including a first gate dielectric material and a second gate dielectric material, the second gate dielectric material including a thinner thickness than the first gate dielectric material, and a high-k dielectric material on the split-gate dielectric material.

20 Claims, 10 Drawing Sheets

HIGH VOLTAGE EXTENDED DRAIN MOSFET (EDMOS) DEVICES IN A HIGH-K METAL GATE (HKMG)

FIELD OF THE INVENTION

The present disclosure relates to semiconductor devices, and more particularly, to high voltage extended drain MOSFET (EDMOS) devices in a high-k metal gate (HKMG) and methods of manufacture.

BACKGROUND

A metal-oxide-semiconductor field-effect transistor (MOSFET) is designed to handle significant power levels. Compared to the other semiconductor devices, such as an insulated-gate bipolar transistor (IGBT) or a thyristor, its main advantages are high switching speed and good efficiency at low voltages. The MOSFET exhibits low gate drive power, fast switching speed, easy advanced paralleling capability, wide bandwidth, and simple biasing. The MOSFET can be found in a wide range of applications, such as most power supplies, DC-to-DC converters, low-voltage motor controllers, and many other applications.

Audio drivers and other integrated circuitry require extended drain MOSFET (EDMOS) devices up to 20 volts and polySiON technology nodes below 40 nm. For a CMOS technology node under 40 nm, the node must feature a high-k metal gate (HKMG). Therefore, to obtain the smaller nodes, audio drivers and other integrated circuitry need to be formed with a HKMG flow.

SUMMARY

In an aspect of the disclosure, a structure includes a plurality of extended drain MOSFET (EDMOS) devices on a high voltage well with a split-gate dielectric material including a first gate dielectric material and a second gate dielectric material, the second gate dielectric material including a thinner thickness than the first gate dielectric material, and a high-k dielectric material on the split-gate dielectric material.

In another aspect of the disclosure, a structure includes a n-type extended drain MOSFET (n-EDMOS) device in an integrated circuit which includes a high-k dielectric material, a high voltage gate oxide, and another gate oxide, a p-type extended drain MOSFET (p-EDMOS) device in the integrated circuit which includes the high-k dielectric material, the high voltage gate oxide, and the another gate oxide, a plurality of high-k metal gate (HKMG) platform devices with the high-k dielectric material, the another gate oxide, and a channel material in the integrated circuit, and a stepped feature between the high voltage gate oxide and the another gate oxide.

In another aspect of the disclosure, a method includes forming a high voltage well in a semiconductor material, forming extended drain MOSFET (EDMOS) devices on the high voltage well with a split-gate oxide including a first gate oxide and a second gate oxide which has a thinner thickness than the first gate oxide, and forming high-k metal gate (HKMG) platform devices with a high-k dielectric material and at least one channel comprising silicon germanium (SiGe) including at least one of a thin oxide and a thick oxide in complementary metal-oxide-semiconductor (CMOS) field effect transistors.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

Figure 1:
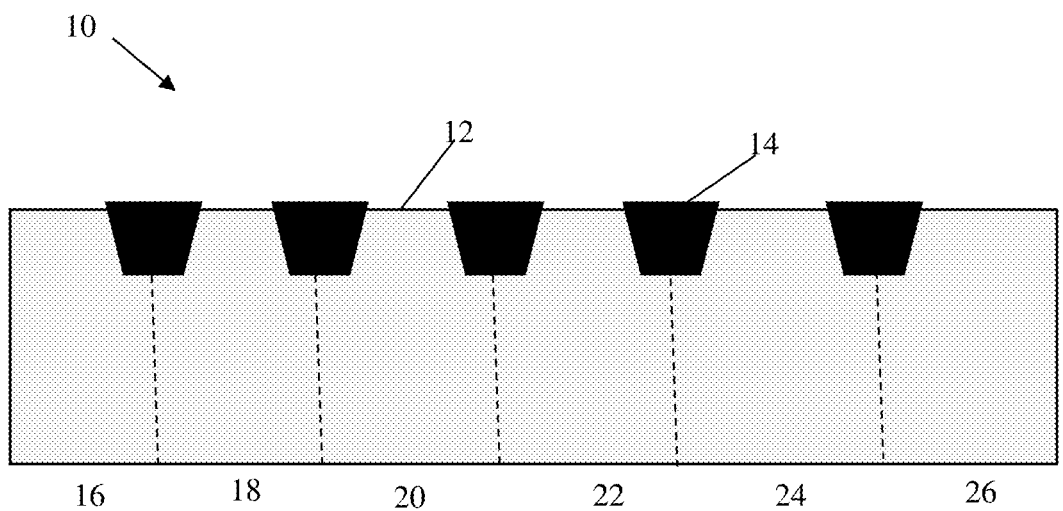
FIG. 1 shows shallow trench isolation modules, amongst other features, and respective fabrication processes in accordance with aspects of the present disclosure.

The present disclosure relates to semiconductor devices, and more particularly, to high voltage extended drain MOSFET (EDMOS) devices and methods of manufacture. More specifically, the present disclosure provides split gate oxide high voltage (HV) extended drain MOSFET (EDMOS)

devices with a high-k metal gate (HKMG). In the split gate oxide HV EDMOS devices, the gate oxide HV also serves as a hard mask for pfet channel silicon germanium (SiGe) formation. Accordingly and advantageously, by implementing the devices disclosed herein, the HKMG first flow produces EDMOS devices up to approximately 20 volts while still featuring thin oxide/thick oxide pfets with a SiGe channel.

In embodiments of the present disclosure, a process integration of HV wells and a split gate oxide into a HKMG gate first flow is compatible with SiGe channel formation for thin gate oxide pfets. In embodiments, a split gate oxide HV EDMOS device include a HKMG first approach where a HV gate oxide serves as a hard mask for pfet channel SiGe formation. Further, it is also contemplated to add high-k dielectric upon the thick and thin gate oxides to migrate applications/circuits from higher technology nodes to technology nodes under 40 nanometers. For example, a method may include formation of HV wells, formation of EDMOS devices in a split gate oxide (GOX) integration, formation of HKMG platform devices featuring SiGe channels and thin and thick gate oxides. The method also includes a HV gate oxide which is used as hardmask for SiGe formation.

In another example, a structure and method of forming a high-k dielectric layer upon a dual thickness gate dielectric (e.g., thin and thick oxide) includes forming a continuous layer of a thick gate oxide upon a substrate. Openings are formed in the thick gate oxide (e.g., openings of the HV gate oxide 38 in FIG. 7). SiGe material is provided within the openings of the thick gate oxide while a portion of thick gate oxide remains. A thin gate oxide is formed upon the remaining portion of thick gate oxide and the substrate where the thick gate oxide has been removed. A high-k gate dielectric is provided on the thin and thick gate oxides, followed by forming a gate conductor upon the high-k gate dielectric. In a further example, a method of fabrication includes forming a full layer of thick gate oxide, patterning to form small and large portions of thick gate oxide, then mask to remove smaller portions but leave a remaining larger portion, and then form high-k dielectric upon thick/thin gate oxides.

The devices of the present disclosure can be manufactured in a number of ways using a number of different tools. In general, though, the methodologies and tools are used to form structures with dimensions in the micrometer and nanometer scale. The methodologies, i.e., technologies, employed to manufacture the devices of the present disclosure have been adopted from integrated circuit (IC) technology. For example, the structures are built on wafers and are realized in films of material patterned by photolithographic processes on the top of a wafer. In particular, the fabrication of the devices uses three basic building blocks: (i) deposition of thin films of material on a substrate, (ii) applying a patterned mask on top of the films by photolithographic imaging, and (iii) etching the films selectively to the mask.

FIG. 1 shows shallow trench isolation modules, amongst other features and respective fabrication processes, in accordance with aspects of the present disclosure. In FIG. 1, the structure 10 includes a bulk semiconductor material 12. The semiconductor material 12 may comprise any suitable semiconductor material. In FIG. 1, the bulk semiconductor material 12 includes different device sections including a device gate (DG)-nfet region 16, a DG-pfet region 18, a thick gate (TG)-nfet region 20, a TG-pfet region 22, a n-EDMOS region 24, and a p-EDMOS region 26. As should be understood by those of skill in the art, DG represents a standard gate oxide thickness, TG represents a thicker gate oxide for higher I/O voltages with respect to the DG oxide thickness, n-EDMOS represents a n-type extended drain MOSFET, and a p-MOS represents a p-type extended drain MOSFT.

FIG. 1 further shows a plurality of shallow trench isolation (STI) structures 14. In embodiments, the shallow trench isolation (STI) structures 14 are formed by conventional lithography, etching and deposition methods known to those of skill in the art. For example, a resist formed over the bulk semiconductor material 12 is exposed to energy (light) to form a pattern (opening). An etching process with a selective chemistry, e.g., reactive ion etching (RIE), will be used to form one or more trenches in the bulk semiconductor material 12 through the openings of the resist, extending into the bulk semiconductor material 12. Following the resist removal by a conventional oxygen ashing process or other known stripants, insulator material, e.g., silicon oxide (in case of CMOS technologies), can be deposited by any conventional deposition processes, e.g., chemical vapor deposition (CVD) processes. Any residual material on the surface of the bulk semiconductor material 14 can be removed by conventional chemical mechanical polishing (CMP) processes. In embodiments, the insulator material deposited in the STI structures 14 can be at a higher level than a top surface of the bulk semiconductor material 12.

Figure 2:
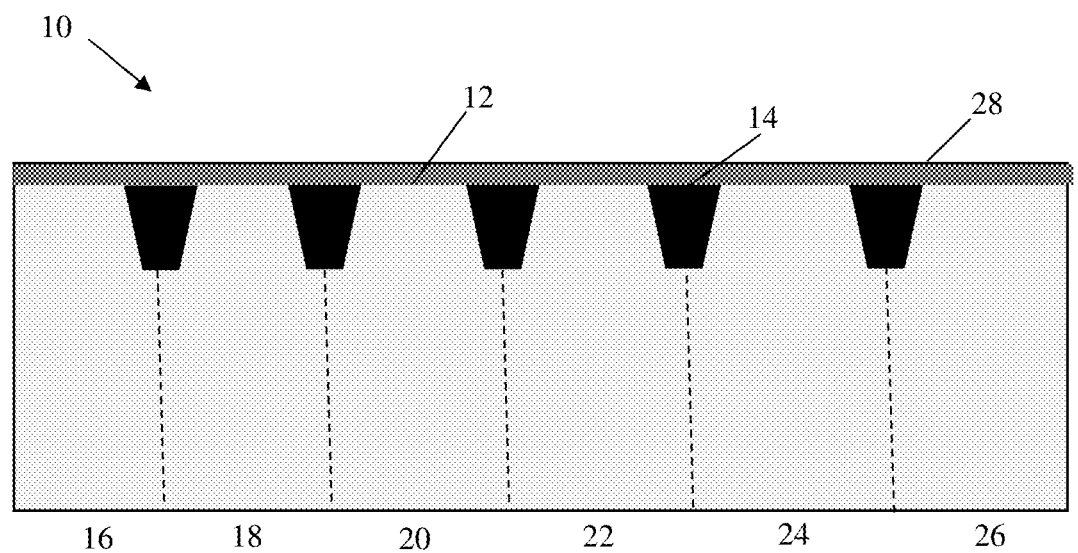
FIG. 2 shows a sacrificial oxide deposition over the shallow trench modules, amongst other features and respective fabrication processes in accordance with aspects of the present disclosure.

FIG. 2 shows a thick sacrificial silicon oxide deposition, amongst other features, and respective fabrication processes. Specifically, in FIG. 2, a thick sacrificial oxide 28 is deposited on the bulk semiconductor material 14 by conventional deposition processes, e.g., CVD processes, to prevent silicon damage during high voltage (HV) implants. In embodiments, the thick sacrificial oxide 28 can have a thickness of 100 Å to 250 Å; although other dimensions are contemplated herein.

Figure 3:
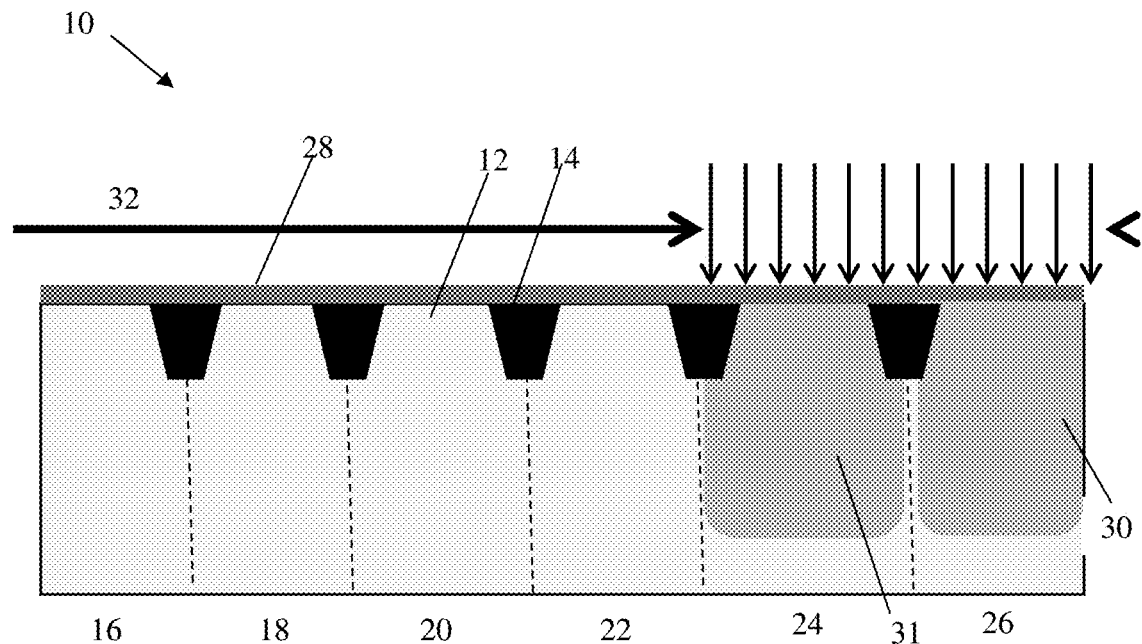
FIG. 3 shows a deep n-well implant (with other well implants not explicitly shown), amongst other features, and respective fabrication processes in accordance with aspects of the present disclosure.

In FIG. 3, the bulk semiconductor material 12 can be subjected to an ion implantation process to form a P-well 31 and N-well 30, particularly in the n-EDMOS region 24 and the p-EDMOS region 26, respectively. For example, the N-well 30 can be doped or implanted with n-type dopants, e.g., Arsenic (As), Phosphorus (P) and Antimony (Sb), among other suitable examples. In addition, the P-well 31 can be doped or implanted with p-type dopants, e.g., Boron (B), among other suitable examples.

In embodiments, the N-well 30 may be formed by introducing a concentration of a dopant in the bulk semiconductor material 14. In embodiments, a patterned implantation mask 32 may be used to define selected areas exposed for the implantation (i.e., the implantation mask 32 is indicated by the horizontal arrow). The implantation mask 32 may include a layer of a light-sensitive material, such as an organic photoresist, applied by a spin coating process, pre-baked, exposed to light projected through a photomask, baked after exposure, and developed with a chemical developer. The implantation mask 32 has a thickness and stopping power sufficient to block the masked areas against receiving a dose of the implanted ions. Following the implantation process, an annealing can be performed to drive in the dopants, as is understood by those of skill in the art.

In embodiments, the N-well 30 and P-well 31 may be subjected to a high voltage (HV) specific dose (i.e., a HV well). For example, the N-well 30 and P-well 31 may be used for at least 5, 8, or 12 volt EDMOS. As is known, the n-EDMOS region 24 and the p-EDMOS region 26 have different wells and drain extension implants. In embodiments, the n-EDMOS region 24 includes the P-well 31 and an n+ drain extension. Also, the p-EDMOS region 26 includes the N-well 30 and a p+ drain extension. However, in embodiments, different implants, dosages and/or concentrations can be included in the HV sections of the n-EDMOS region 24 and the p-EDMOS region 26. Further, the N-well 30 and the P-well 31 may have high voltage (HV) well implants for a source and a drain. After the implantation process is completed, annealing can be completed at approximately 1050° C. for two hours to provide a smooth doping profile to handle the high voltage.

Figure 4:
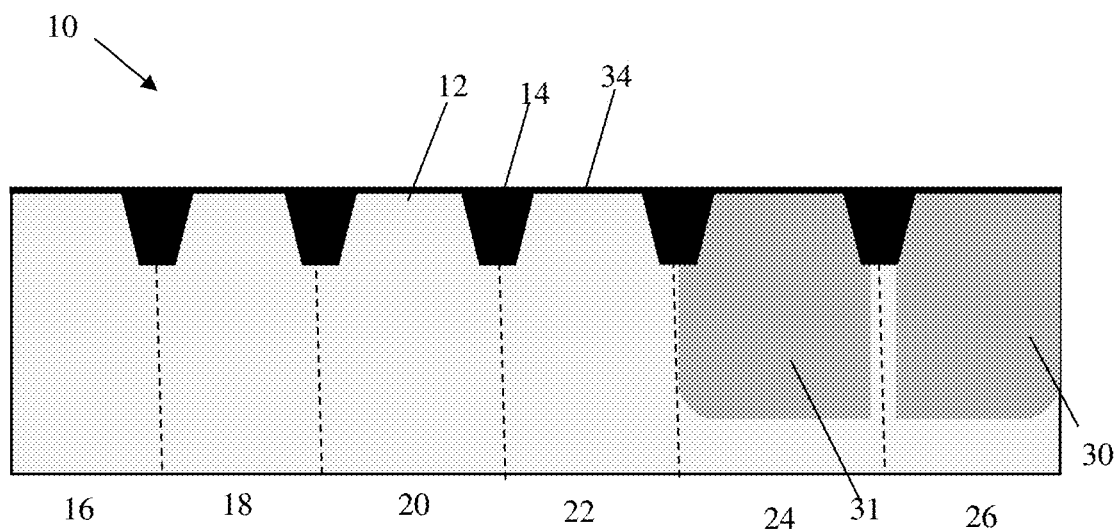
FIG. 4 shows a thin sacrificial oxide deposition, amongst other features, and respective fabrication processes in accordance with aspects of the present disclosure.

FIG. 4 shows a thin sacrificial oxide 34, amongst other features, and respective fabrication processes. In FIG. 4, the thick sacrificial oxide 28 is removed by conventional etching processes, i.e., isotropic etching processes. Then, a thin sacrificial oxide 34 is deposited by any conventional deposition processes, e.g., CVD processes or a thermal growth deposition. In embodiments, the thin sacrificial oxide 34 can have a thickness of 20 Å to 70 Å; although other dimensions are contemplated herein.

Figure 5:
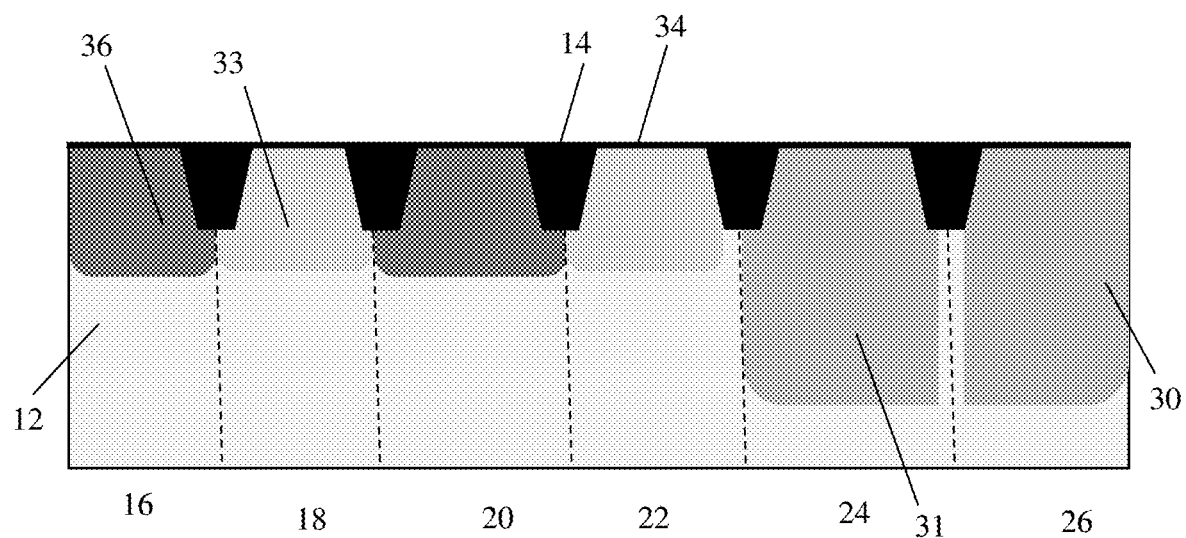
FIG. 5 shows n-well and p-well implants, amongst other features, and respective fabrication processes in accordance with aspects of the present disclosure.

FIG. 5 shows n-well and p-well implants, amongst other features, and respective fabrication processes. In FIG. 5, the N-wells 33 and the P-wells 36 are pre-gate platform implants used for platform devices (i.e., DG-nfet region 16, DG-pfet region 18, TG-nfet region 20, and TG-pfet region 22). For example, in FIG. 5, the bulk semiconductor material 12 is subjected to an ion implantation process to form N-wells 33 in the DG-pfet region 18 and TG-pfet region 22, and P-wells 36 in the DG-nfet region 16 and the TG-nfet region 20. In embodiments, the P-wells 36 can be doped or implanted with p-type dopants, e.g., Boron (B), and the N-wells 33 can be doped or implanted with n-type dopants, e.g., Arsenic (As), Phosphorus (P) and Antimony (Sb), among other suitable examples.

In embodiments, the N-wells 33 and the P-wells 36 may be formed by introducing a concentration of a different dopant of opposite conductivity type in the bulk semiconductor material 12. For example, respective patterned implantation masks may be used to define selected areas exposed for the implantation. The implantation mask used to select the exposed area for forming the N-wells 33 and the P-wells 36 is stripped after implantation, and before the implantation mask used to form other wells of a different type. As already described herein, each of the implantation masks has a thickness and stopping power sufficient to block masked areas against receiving a dose of the implanted ions. Following the implantation process, an annealing can be performed to drive in the dopants, as is understood by those of skill in the art. After the implantation process is completed, annealing can be performed at approximately 1050° C. for a few seconds to freeze the implant scheme.

Figure 6:
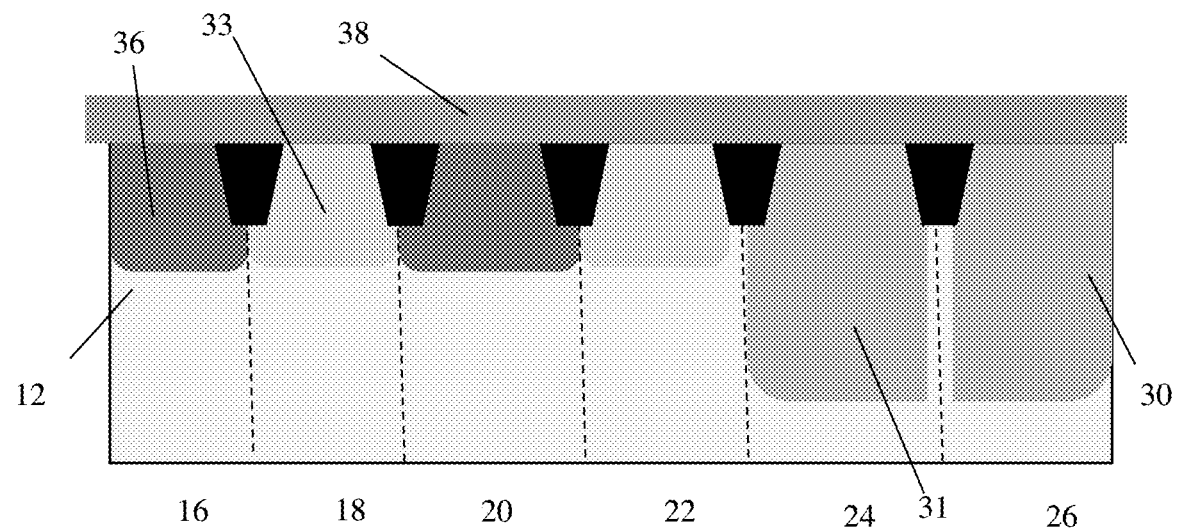
FIG. 6 shows a high voltage gate oxide deposition, amongst other features, and respective fabrication processes in accordance with aspects of the present disclosure.

FIG. 6 shows a high voltage gate oxide, amongst other features, and respective fabrication processes. Specifically, in FIG. 6, the thin sacrificial oxide 34 is removed by conventional wet etching processes (e.g., which can use hydrofluoric (HF) acid for silicon dioxide) followed by deposition of a high voltage (HV) gate oxide 38 on the N-wells 33 and the P-wells 36 using conventional deposition processes, e.g., chemical vapor deposition (CVD) processes or plasma-enhanced chemical vapor deposition (PECVD) processes or high-temperature oxide (HTO). In embodiments, the HV gate oxide 38 is utilized as a protective layer for a silicon germanium (SiGe) growth process in a channel of a DG/TG pfet device, while preventing SiGe growth in unwanted areas. It is preferred to deposit the HV gate oxide 38 prior to the SiGe growth since this layer would otherwise be subjected to the high temperature of the HV gate oxide 38. Therefore, depositing the HV gate oxide 38 has to be performed prior to the depositing of SiGe, thereby avoiding any reliability issues with SiGe material used in the channel region. In embodiments, the high voltage (HV) gate oxide 38 can have a thickness of 250 Å to 350 Å; although other dimensions are contemplated herein. Advantageously, the HV gate oxide 38 allows EDMOS device voltages of 20 volts.

Figure 7:
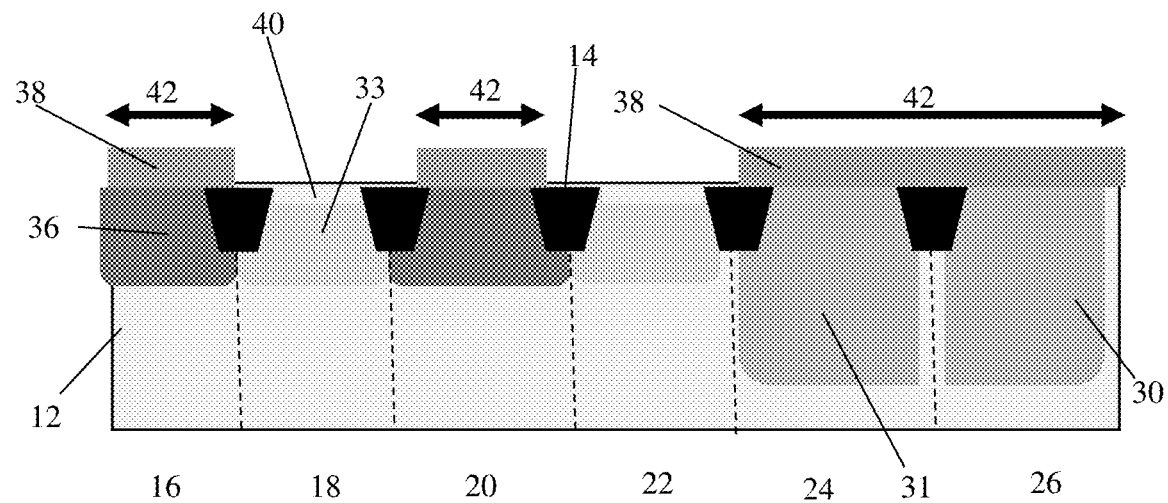
FIG. 7 shows a silicon germanium growth, amongst other features, and respective fabrication processes in accordance with aspects of the present disclosure.

In FIG. 7, portions of the HV gate oxide 38 are removed by an etching process with a selective chemistry, e.g., RIE followed by a wet or dry etching process. The remaining HV GOx areas act as mask 42 to block growth of SiGe material in the DG-nfet region 16, the TG-nfet region 20, the n-EDMOS region 24, and the p-EDMOS region 26; whereas, SiGe material 40 is grown in the unblocked regions, i.e., in the channel of the pfets (i.e., DG-pfet region 18 and the TG-pfet region 22). In embodiments, the SiGe material 40 can have a thickness of 6 to 10 nm; although other dimensions are contemplated herein. Further, the SiGe material 40 can have a range of 15%-40% Ge and 60%-85% Si; although other ranges are contemplated herein.

Figure 8:
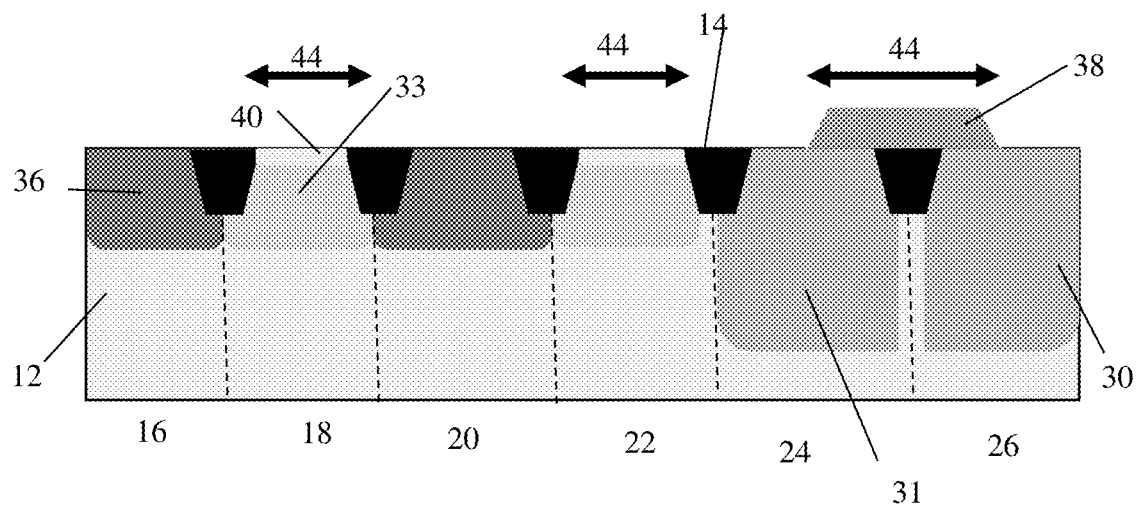
FIG. 8 shows removal of portions of the high voltage (HV) gate oxide, amongst other features, and respective fabrication processes in accordance with aspects of the present disclosure.

FIG. 8 shows removal of portions of the HV gate oxide 38 in accordance with aspects of the present disclosure. For example, in FIG. 8, portions of the HV gate oxide 38 (i.e., DG-nfet region 16 and the TG-nfet region 20) are removed by an etching process, e.g., reactive ion etch (RIE) followed by a wet etching process. For silicon oxide, as an example, the wet etching process includes an adjusted hydrofluoric (HF) acid budget for a thicker oxide in the n-EDMOS region 24 and the p-EDMOS region 26. A mask (e.g., resist) represented by arrows 44 is used to protect the SiGe material 40, as well as the oxide material 38 in the n-EDMOS region 24 and the p-EDMOS region 26, while allowing the etching process to remove the HV gate oxide 38 from the nfet (i.e., DG-nfet region 16 and the TG-nfet region 20). The remaining portions of the HV gate oxide 38, after etching, will have a tapered and smooth topography. The non-etched or protected portions of the HV gate oxide 38 will be a thick oxide for a lateral diffusion area. Further, as a result of the etching, a split gate oxide is formed below the gate; that is, a transition from a thick to thin oxide will be formed below the gate with a stepped feature.

Figure 9:
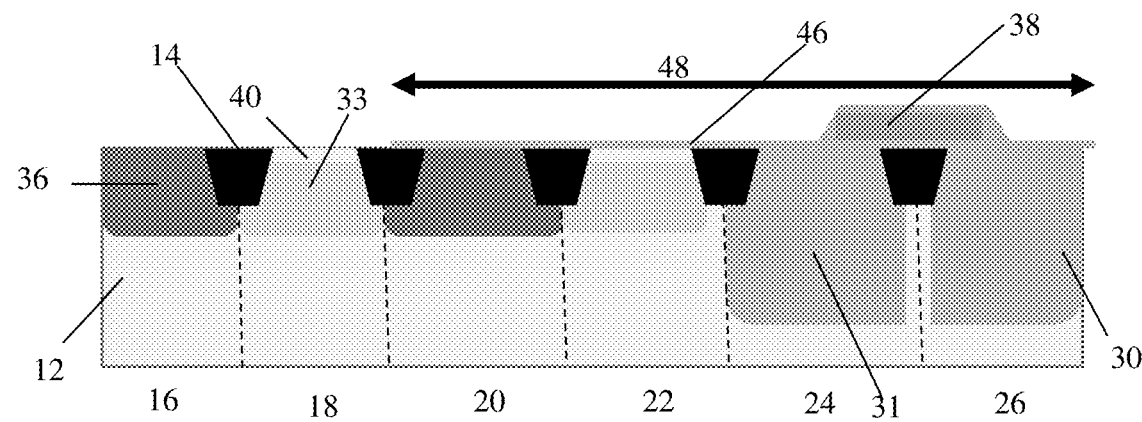
FIG. 9 shows a gate oxide deposition, amongst other features, and respective fabrication processes in accordance with aspects of the present disclosure.

FIG. 9 shows deposition of a TG gate oxide 46 over the regions 20, 22, 24, 26. Specifically, in FIG. 9, a TG gate oxide 46 is deposited (e.g., using CVD process) over the entire structure, followed by an etching process to remove the TG gate oxide 46 over the DG-nfet region 16 and the DG-pfet region 18. In this way, the gate oxide is formed over the regions 20, 22, 24, 26. The etching process includes forming a mask 48 over the TG-nfet region 20, the TG-pfet region 22, the n-EDMOS region 24, and the p-EDMOS region 26 in order protect the TG gate oxide 46 in these regions. In embodiments, the TG gate oxide 46 can have a thickness of 30 Å to 70 Å (depending the desired TG voltage), with the high voltage (HV) gate oxide 38 having a total thickness of approximately 260 Å; although other dimensions are contemplated herein. In embodiments, the TG gate oxide 46 allows device voltages of 3 volts; although other voltages (i.e., 1 volt or lower) are also contemplated herein. Lastly, a pre-clean process can be performed for the high-k metal gate.

Figure 10:
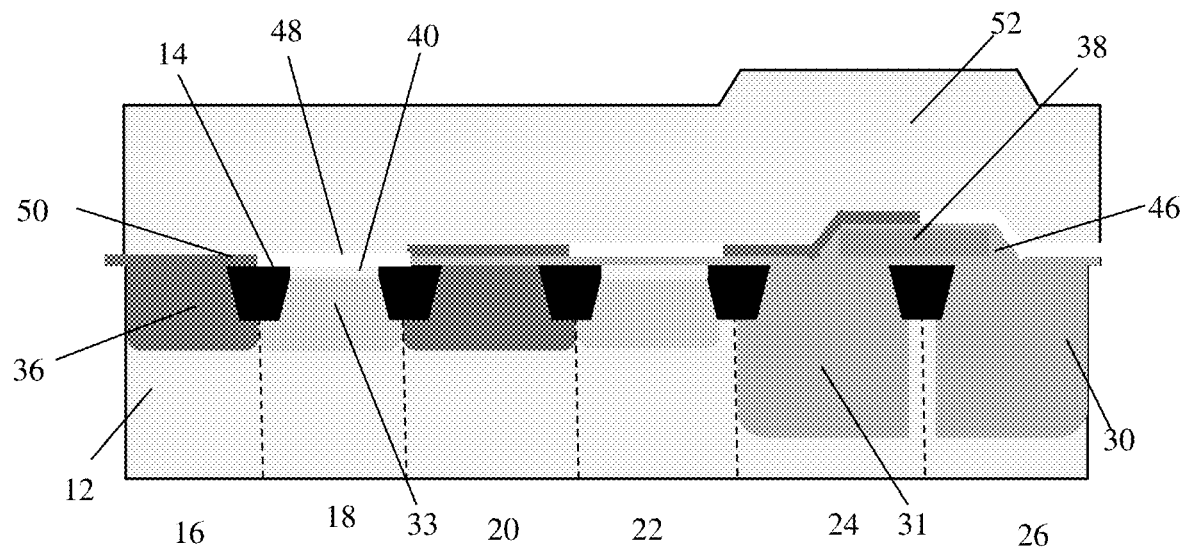
FIG. 10 shows a high-k metal gate, amongst other features, and respective fabrication processes in accordance with aspects of the present disclosure.

In FIG. 10, high-k metal gate (HKMG) (e.g., $HfO_2$, $HfSiO$, $ZrO_2$) and workfunction metals 48 for pfets and workfunction metals 50 for nfets, which have separate mask and deposition processes, are deposited over the structure of FIG. 9. In embodiments, the workfunction metals 48, 50 can be deposited alternatively or in a stacked configuration. Further, in FIG. 10, a silicon material (e.g., poly or amorphous material) 52 is deposited on the workfunction metals 48, 50. In embodiments, the silicon material 52 can have A thickness of 500 Å to 1000 Å, with a preference of 700 Å; although other dimensions are contemplated herein.

Figure 11:
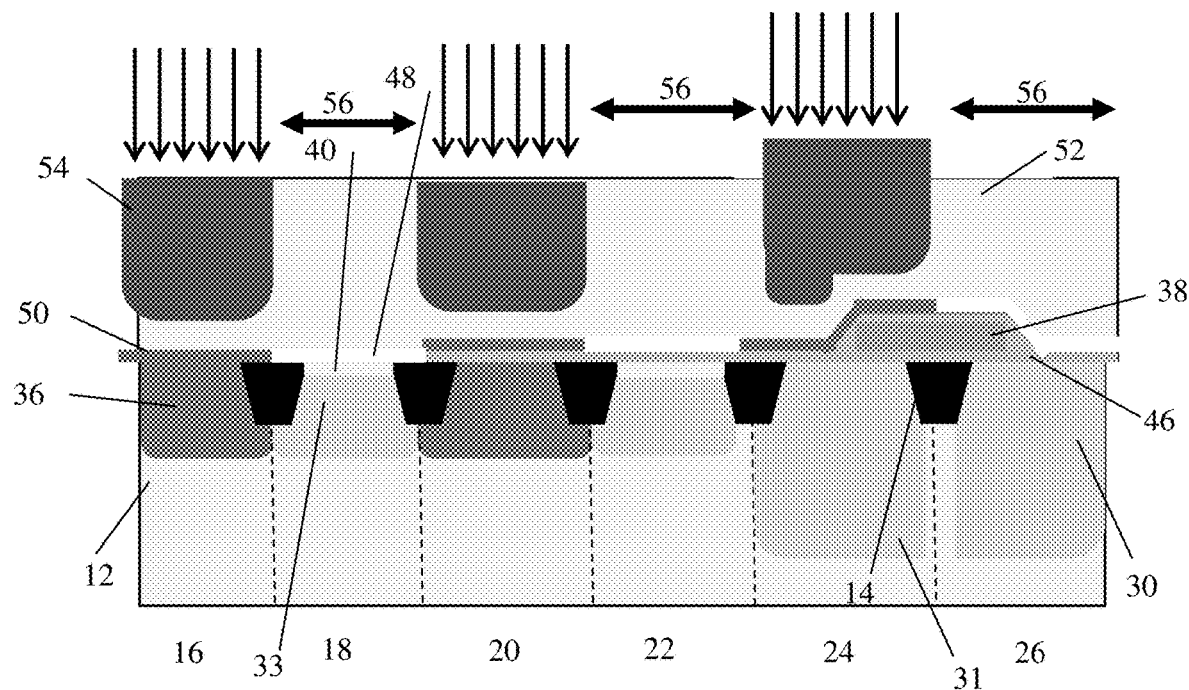
FIG. 11 shows a poly pre-doping of n-type, amongst other features, and respective fabrication processes in accordance with aspects of the present disclosure.

In FIG. 11, the silicon material 52 can optionally be subjected to an implantation process to form pre-doping N-type implants 54 in the DG-nfet region 16, TG-nfet region 20, and the n-EDMOS region 24 to lower the gate resistance. The N-type implants 54 are optional. For example, the pre-doping N-type implants 54 can be doped or implanted with n-type dopants, e.g., Arsenic (As), Phosphorus (P) and Antimony (Sb), among other suitable examples, using mask 56 to protect regions 18, 22, 26. For example, as already described herein, a patterned implantation mask 56 may be used to define selected areas exposed for the implantation. In other embodiments, the implants can be optional.

Figure 12:
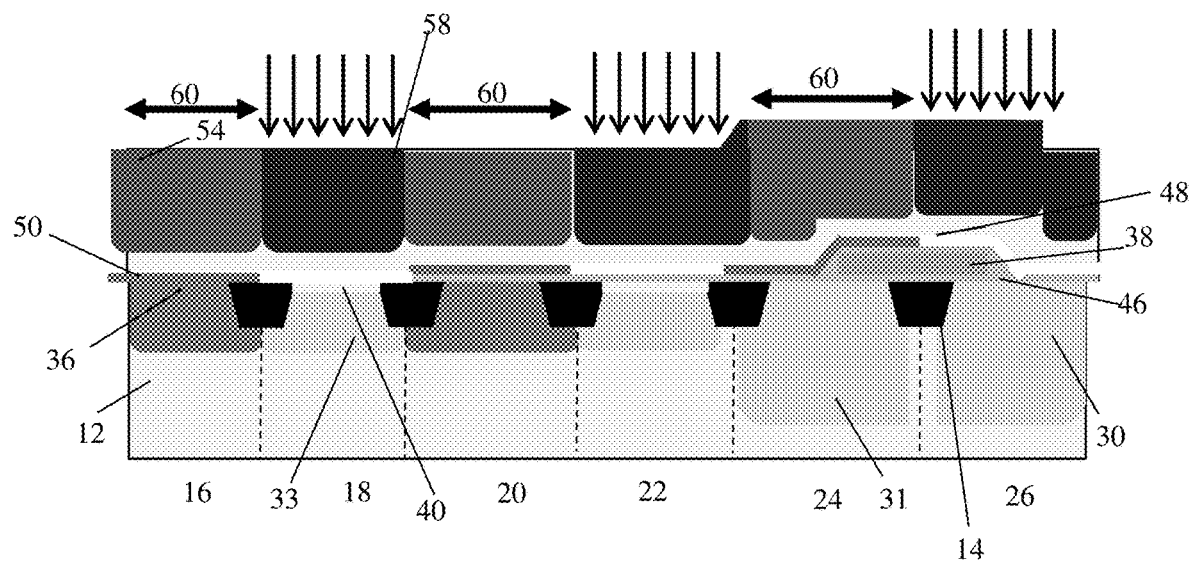
FIG. 12 shows a poly pre-doping of p-type, amongst other features, and respective fabrication processes in accordance with aspects of the present disclosure.

In FIG. 12, the silicon material 52 is subjected to another implantation process to form pre-doping P-type implants 58 in the DG-pfet region 18, TG-pfet 22, and the p-EDMOS 26 to lower resistance. For example, the pre-doping P-type implants 58 can be doped or implanted with p-type dopants, e.g., Boron (B), among other suitable examples. As already described herein, a patterned implantation mask 60 may be used to define selected areas exposed for the implantation.

Figure 13:
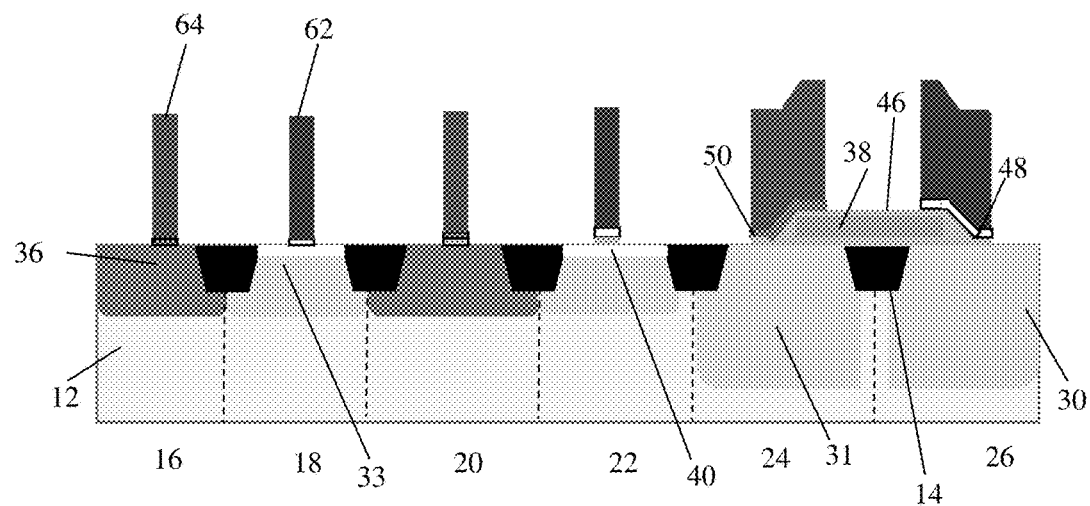
FIG. 13 shows a gate stack, amongst other features, and respective fabrication processes in accordance with aspects of the present disclosure.

In FIG. 13, n-type gates 64 are patterned from the pre-doping N-type implants 54 in the DG-nfet region 16, the TG-nfet region 20, and the n-EDMOS region 24. Further, p-type gates 62 are patterned from the P-type implants 58 in the DG-pfet region 18, the TG-pfet region 22, and the region p-EDMOS 26. The n-type gate 64 and the p-type gate 62 in the EDMOS device (i.e., the n-EDMOS region 24 and the region p-EDMOS 26) are formed over a stepped height due to the different materials used in these regions, e.g., thick oxide 38, 46.

Figure 14:
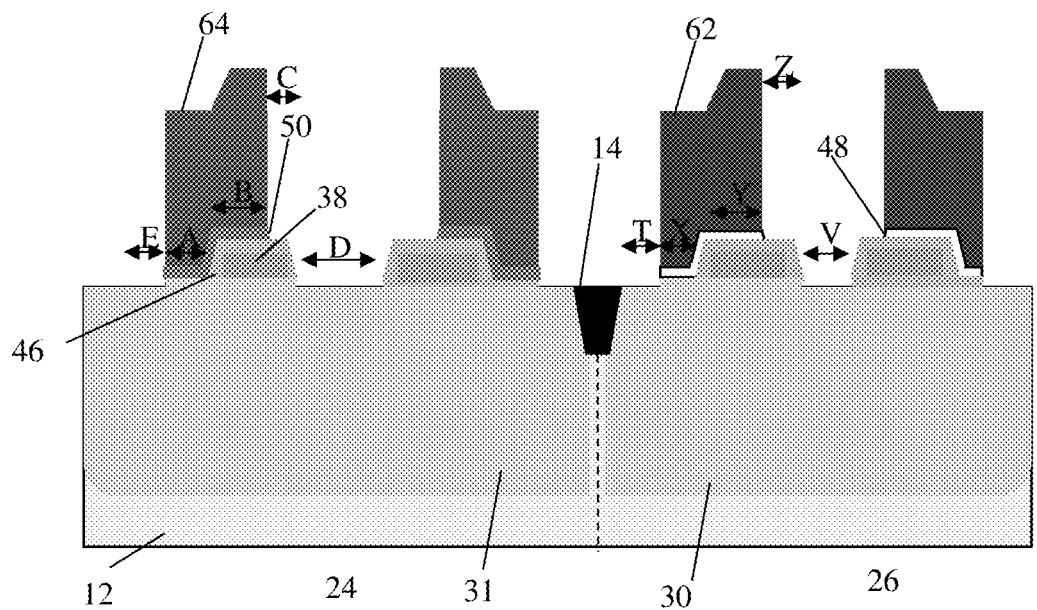
FIG. 14 shows extended drain MOSFET (EDMOS) regions, amongst other features, and respective fabrication processes in accordance with aspects of the present disclosure.

FIG. 14 shows the extended drain MOSFET (EDMOS) regions, e.g., the n-EDMOS region 24 and the p-EDMOS region 26. More specifically, FIG. 14 shows physical dimensions A, B, C, D, and E of the n-EDMOS 24 and physical dimensions T, V, X, Y, and Z of the p-EDMOS 26. By tuning the physical dimensions of the n-EDMOS 24 differently from the p-EDMOS 26, the n-type gate 64 can be tuned differently from the p-type gate 62. In particular, physical dimensions A, B, X, and Y will tune the electrical voltage and the breakdown resistance of the channel. Further, physical dimensions A and X will tune the threshold voltage. Physical dimensions B, C, Y, and Z will tune the current. Physical dimensions D and V correspond with the drain and E and T correspond with the source.

Figure 15:
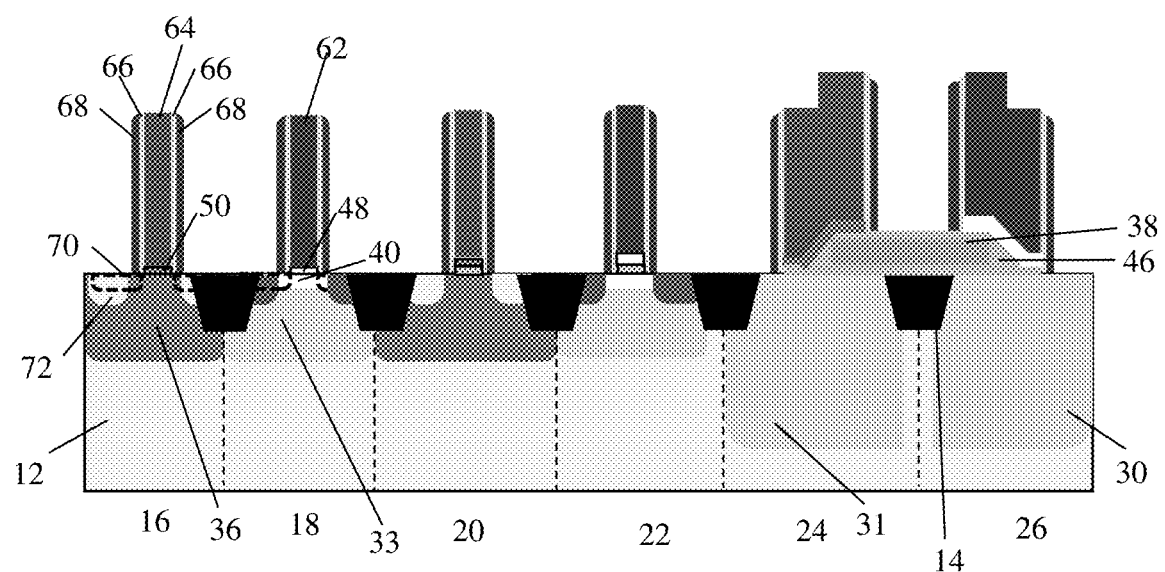
FIG. 15 shows a spacer and lightly doped drain region, amongst other features, and respective fabrication processes in accordance with aspects of the present disclosure.

FIG. 15 shows a spacer and lightly doped drain, amongst other features and respective fabrication processes. In FIG. 15, a first spacer 66 is deposited on sidewalls of the p-type gate 62 and the n-type gate 64 by any conventional deposition processes, e.g., CVD processes, followed by an anisotropic etching process. Further, an optional second spacer 68 is deposited on sidewalls of the first spacer 66 by any conventional deposition processes, e.g., CVD processes, followed by an anisotropic etching process. The anisotropic etching process will remove the spacer material 66, 68 from all horizontal surfaces. Also, lightly doped drain (LDD) formation will form extension implants 70 and halo implants 72 by a low dose implant process. In embodiments, the extension implants 70 and halo implants 72 can also be included in the n-EDMOS region 24 and the p-EDMOS region 26.

In embodiments, the extension implants 70 and halo implants 72 may be formed by introducing a concentration of a different dopant of opposite conductivity type in the N-wells 33 and the P-wells 36. And, as already discussed, respective patterned implantation masks may be used to define selected areas exposed for the implantation. The implantation mask used to select the exposed area for forming the extension implants 70 and halo implants 72 is stripped after implantation, and before the implantation mask used to form other implants of a different type.

Figure 16:
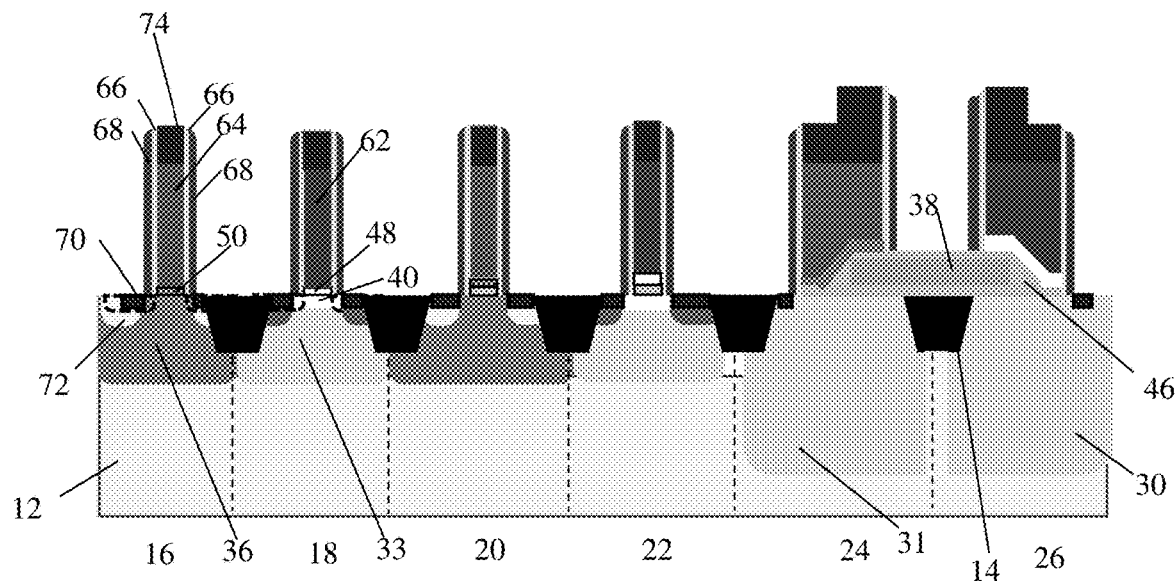
FIG. 16 shows a silicide, amongst other features, and respective fabrication processes in accordance with aspects of the present disclosure.

In FIG. 16, silicide contacts 74 are formed on the p-type gate 62 and the n-type gate 64, and respective source and drain regions. As should be understood by those of skill in the art, the silicide process begins with deposition of a thin transition metal layer, e.g., nickel, cobalt or titanium, over fully formed and patterned semiconductor devices (e.g., the p-type gate 62, the n-type gate 64 and source/drain regions). After deposition of the material, the structure is heated allowing the transition metal to react with exposed silicon (or other semiconductor material as described herein) in the active regions of the semiconductor device (e.g., source, drain, gate contact region) forming a low-resistance transition metal silicide. Following the reaction, any remaining transition metal is removed by chemical etching, leaving silicide contacts 74 in the active regions of the device. In embodiments, the silicide contacts 74 comprise nickel silicon (NiSi).

Figure 17:
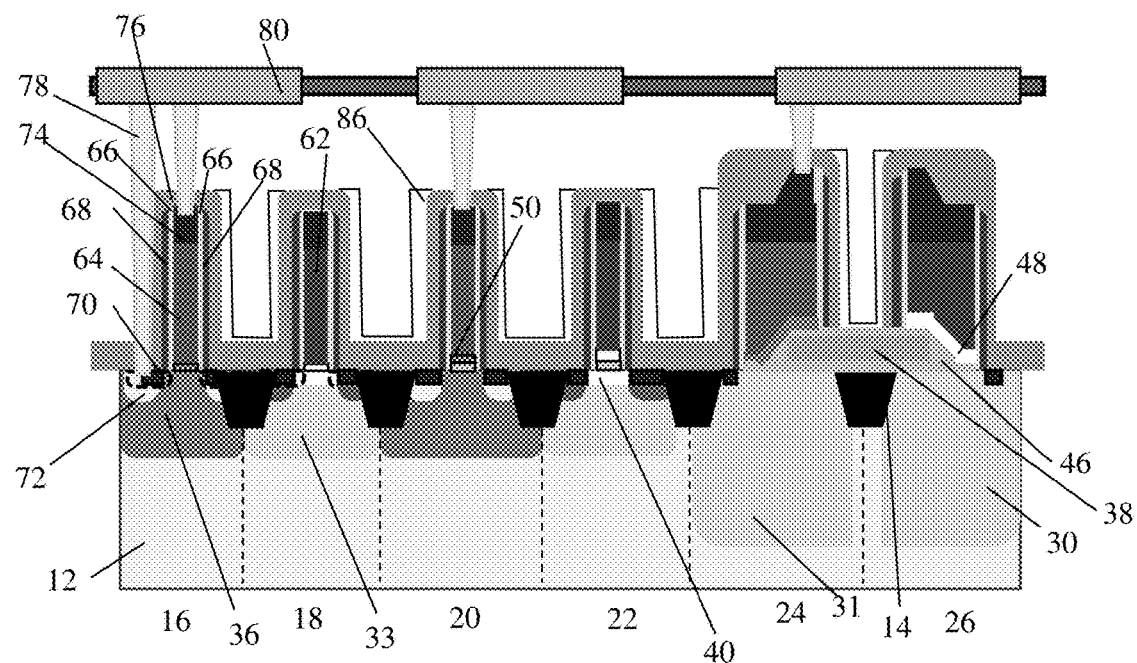
FIG. 17 shows an optional liner and contacts, amongst other features, and respective fabrication processes in accordance with aspects of the present disclosure.

In FIG. 17, a nitride liner 76 (or, in other embodiments, a nitride overlay diffusion barrier layer) can be used to keep a predetermined distance of the p-type gate 62 and the n-type gate 64 from a metal 80. In embodiments, the nitride liner 76 can act as a stress liner to improve device performance. For example, in embodiments, the nitride liner 76 can be tensile or compressive or stress less. Also a dual stress nitride liner module can be applied. Following the silicide process and liner deposition, an interlevel dielectric material 86 (e.g., $SiO_2$) is deposited over the structure using a conventional deposition process, e.g., CVD.

A contact 78 can be formed by conventional lithography, etching and deposition processes. The contact 78 can be source/drain and gate contacts which extend down to the corresponding source/drain and gates, respectively, for each of the fabricated devices. Further, the contact 78 can also be gate contacts which extend to the gates (e.g., the p-type gate 62, the n-type gate 64, etc.) The contact 78 can be tungsten (i.e., tungsten (W) with a TiN barrier liner, as an example); although other contact materials are contemplated herein. Further, the metal 80 can be copper; although other metal materials are contemplated herein.

Figure 18:
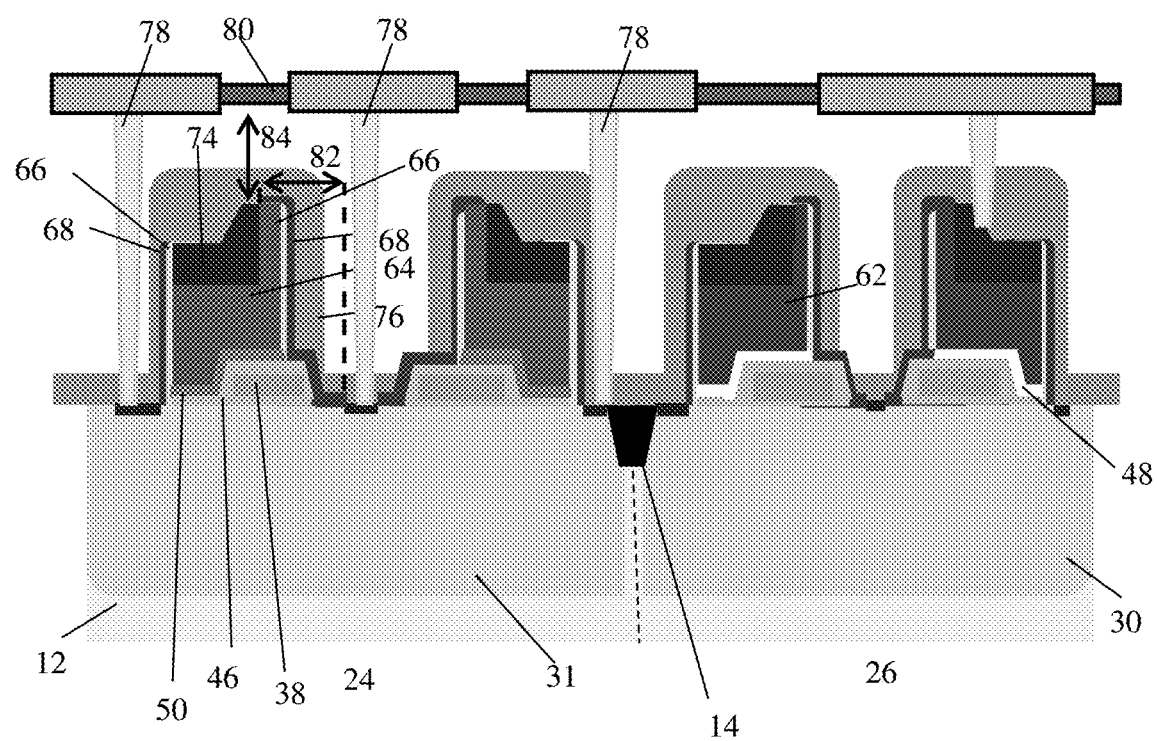
FIG. 18 shows an enlarged extended drain MOSFET (EDMOS), amongst other features.

FIG. 18 shows an enlarged portion of the extended drain MOSFET (EDMOS), amongst other features. More specifically, in FIG. 18, the n-EDMOS region 24 includes the optional second spacer 68 with lateral extensions, as indicated by arrow 82. The arrow 82 is a dimension which indicates the length of the optional second spacer 68 with lateral extensions. Further, in FIG. 18, arrow 84 indicates a dimension of a space between the top of the gate with the silicide contacts 74 and the bottom surface of the metal 80. As stated above in FIG. 17, the contacts 78 can be source/drain contacts which extend to the corresponding source/drain regions, as well as gate contacts 78 that extend to the gate.

A high voltage extended drain MOSFET (EDMOS) device can be utilized in system on chip (SoC) technology. It should be understood by those of skill in the art that SoC is an integrated circuit (also known as a "chip") that integrates all components of an electronic system on a single chip or substrate. As the components are integrated on a single substrate, SoCs consume much less power and take up much less area than multichip designs with equivalent functionality. Because of this, SoCs are becoming the dominant force in the mobile computing (such as Smartphones)

and edge computing markets. SoC is also commonly used in embedded systems and the Internet of Things.

The structures and methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure, comprising:
   a plurality of extended drain MOSFET (EDMOS) devices on a high voltage well with a split-gate dielectric material comprising a first gate dielectric material and a second gate dielectric material, the second gate dielectric material comprising a thinner thickness than the first gate dielectric material; and
   a high-k dielectric material on the split-gate dielectric material.

2. The structure of claim 1, further comprising a plurality of high-k metal gate (HKMG) platform devices which includes the high-k dielectric material and at least one channel material.

3. The structure of claim 2, wherein the second gate dielectric material is on the HKMG platform devices and the at least one channel material comprises silicon germanium (SiGe).

4. The structure of claim 3, wherein the first gate dielectric material comprises a high voltage gate oxide and the second gate dielectric material comprises another gate oxide which is on the high voltage gate oxide.

5. The structure of claim 2, wherein the at least one channel material comprising SiGe includes a first SiGe channel formed in a first PFET device and a second SiGe channel formed in a second PFET device.

6. The structure of claim 5, wherein the first gate dielectric material and the second gate dielectric material are part of the plurality of EDMOS devices, and the EDMOS devices comprise a n-EDMOS device and a p-EDMOS device.

7. The structure of claim 6, wherein the high-k dielectric material is on the second gate dielectric material and a portion of the plurality of high-k metal gate (HKMG) platform devices is devoid of the first gate dielectric material and the second gate dielectric material.

8. The structure of claim 7, further comprising:
   a plurality of work function metals on the first gate dielectric material, the second gate dielectric material, and the high-k material; and
   a plurality of gates over the first gate dielectric material, the second gate dielectric material, and the high-k dielectric material.

9. The structure of claim 8, wherein the split gate dielectric material comprises a stepped feature between the first gate dielectric material and the second gate dielectric material.

10. The structure of claim 1, wherein the high voltage well comprises a n-well and a p-well.

11. The structure of claim 1, wherein the first gate dielectric material has a thickness in a range of 250 Å to 350 Å, and the second gate dielectric material has a thickness in the range of 30 Å to 70 Å.

12. A structure, comprising:
    a n-type extended drain MOSFET (n-EDMOS) device in an integrated circuit which includes a high-k dielectric material, a high voltage gate oxide, and another gate oxide;
    a p-type extended drain MOSFET (p-EDMOS) device in the integrated circuit which includes the high-k dielectric material, the high voltage gate oxide, and the another gate oxide;
    a plurality of high-k metal gate (HKMG) platform devices with the high-k dielectric material, the another gate oxide, and a channel material in the integrated circuit; and
    a stepped feature between the high voltage gate oxide and the another gate oxide.

13. The structure of claim 12, wherein the another gate oxide is a part of the HKMG platform devices and the channel material comprises silicon germanium (SiGe).

14. The structure of claim 13, wherein the channel material comprises a first SiGe channel formed in a first PFET device and a second SiGe channel formed in a second PFET device.

15. The structure of claim 14, wherein the another gate oxide is on the high voltage gate oxide.

16. The structure of claim 15, wherein the high-k dielectric material is on the another gate oxide.

17. The structure of claim 12, wherein the high voltage gate oxide has a thickness in a range of 250 Å to 350 Å.

18. The structure of claim 17, wherein the another gate oxide has the thickness in the range of 30 Å to 70 Å.

19. The structure of claim 12, further comprising:
    a plurality of work function metals on the high voltage gate oxide, the another gate oxide, and the high-k dielectric material; and
    a plurality of gates over the high voltage gate oxide, the another gate oxide, and the high-k dielectric material.

20. A method, comprising:
    forming a high voltage well in a semiconductor material;
    forming extended drain MOSFET (EDMOS) devices on the high voltage well with a split-gate oxide comprising a first gate oxide and a second gate oxide which has a thinner thickness than the first gate oxide; and
    forming high-k metal gate (HKMG) platform devices with a high-k dielectric material and at least one channel comprising silicon germanium (SiGe) comprising at least one of a thin oxide and a thick oxide in complementary metal-oxide-semiconductor (CMOS) field effect transistors.

* * * * *